United States Patent
Wang

(10) Patent No.: US 9,803,275 B2
(45) Date of Patent: Oct. 31, 2017

(54) METHOD FOR MANUFACTURING GRAPHENE COMPOSITE ELECTRODE MATERIAL

(71) Applicant: Shenzhen China Star Optoelectronics Technology Co., Ltd., Shenzhen, Guangdong (CN)

(72) Inventor: Yewen Wang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 663 days.

(21) Appl. No.: 14/241,064

(22) PCT Filed: Jan. 13, 2014

(86) PCT No.: PCT/CN2014/070546
§ 371 (c)(1),
(2) Date: Feb. 25, 2014

(87) PCT Pub. No.: WO2015/100795
PCT Pub. Date: Jul. 9, 2015

(65) Prior Publication Data
US 2015/0275353 A1  Oct. 1, 2015

(30) Foreign Application Priority Data
Dec. 30, 2013  (CN) .......................... 2013 1 0746256

(51) Int. Cl.
C23C 14/35  (2006.01)
C23C 14/34  (2006.01)
(Continued)

(52) U.S. Cl.
CPC .............. C23C 14/34 (2013.01); C03C 17/36 (2013.01); C03C 17/3605 (2013.01);
(Continued)

(58) Field of Classification Search
CPC ..... C23C 16/26; C23C 16/042; C23C 14/185; C23C 14/14
See application file for complete search history.

(56) References Cited

U.S. PATENT DOCUMENTS

| | | | | |
|---|---|---|---|---|
| 6,113,761 A | * | 9/2000 | Kardokus | ........... C23C 14/3407 204/298.13 |
| 2011/0198558 A1 | * | 8/2011 | Okai | ................... H01L 21/2855 257/9 |
| 2013/0330523 A1 | * | 12/2013 | Zhang | ................. C01B 31/0213 428/195.1 |

FOREIGN PATENT DOCUMENTS

| | | | | |
|---|---|---|---|---|
| CN | 102646795 A | * | 8/2012 | |
| JP | 11228160 A | * | 8/1999 | |
| TW | 201341554 A | | 10/2013 | |

* cited by examiner

*Primary Examiner* — Jason Berman
(74) *Attorney, Agent, or Firm* — Andrew C. Cheng

(57) ABSTRACT

The present invention provides a method for manufacturing a graphene composite electrode material, including the following steps: (1) providing a glass substrate, the glass substrate having a melting point greater than 1100° C.; (2) washing the glass substrate and then forming a metal film on the glass substrate; (3) patterning the metal film to form a circuit pattern; and (4) forming a graphene film on the circuit pattern so as to form a graphene composite electrode material. The method for manufacturing a graphene composite electrode material according to the present invention uses a temperature resistant glass substrate and a metal catalyst to directly grow a graphene film on a circuit pattern thereby requiring no transfer, not affected by solvent applied in transfer, having relatively high quality of film formation, requiring no etching, allowing for direct formation of a graphene composite electrode material, having a simple process, providing an effect of protection of the metal circuit pattern due to stable chemical property of graphene, and thus (Continued)

effectively extending the service life of the graphene composite electrode material.

14 Claims, 1 Drawing Sheet

(51) Int. Cl.
    *C23C 16/04*     (2006.01)
    *C23C 16/26*     (2006.01)
    *C23C 14/18*     (2006.01)
    *C23C 14/14*     (2006.01)
    *C23C 14/16*     (2006.01)
    *C23C 14/58*     (2006.01)
    *G09G 5/00*     (2006.01)
    *C03C 17/36*     (2006.01)
    *H01G 9/042*     (2006.01)
    *H01G 11/36*     (2013.01)

(52) U.S. Cl.
    CPC .......... *C03C 17/3634* (2013.01); *C23C 14/14* (2013.01); *C23C 14/165* (2013.01); *C23C 14/185* (2013.01); *C23C 14/5873* (2013.01); *C23C 16/042* (2013.01); *C23C 16/26* (2013.01); *G09G 5/00* (2013.01); *G09G 2300/0426* (2013.01); *H01G 9/042* (2013.01); *H01G 11/36* (2013.01)

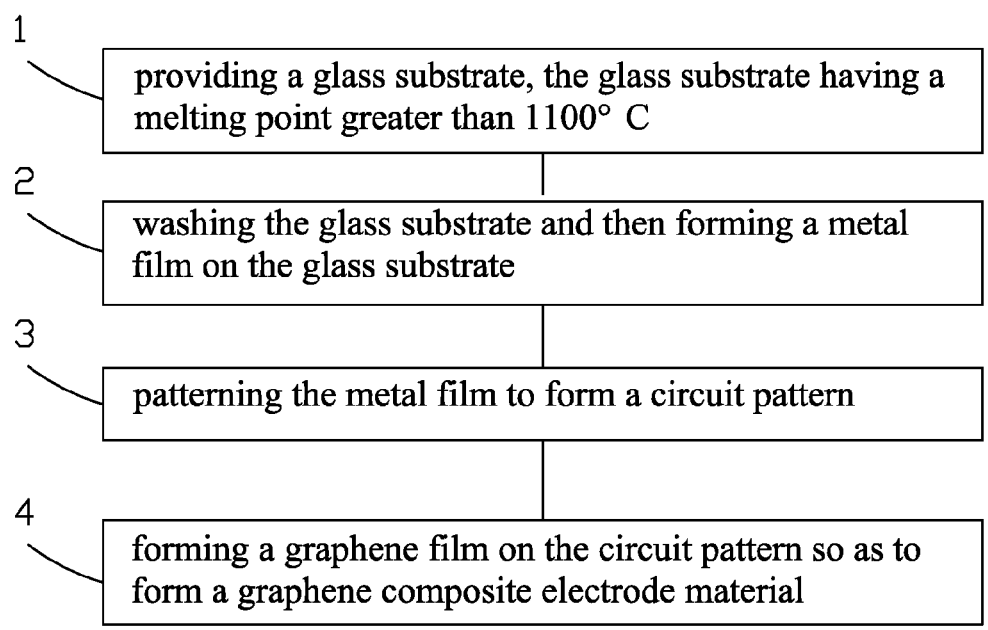

METHOD FOR MANUFACTURING GRAPHENE COMPOSITE ELECTRODE MATERIAL

BACKGROUND OF THE INVENTION

1. Field of the Invention

The present invention relates to a method for manufacturing a composite electrode material, and in particular to a method for manufacturing a graphene composite electrode material.

2. The Related Arts

Graphene is a novel carbon based material having a two dimensional honeycomb like structure of a single layer densely packed carbon atoms. Graphene is the thinnest and toughest nanometer material that is currently known and is almost totally transparent, absorbing only 2.3% of light, and has resistivity of only approximately $10^{-6}$ Ω·cm, which is much lower that copper or silver, making it a material having the lowest resistivity in the world at present. Graphene can be manufactured with various processes, such as chemical vapor deposition (CVD), micro-electromechanical separation, and epitaxy.

Graphene has an extremely large specific surface area, high conductivity, and high mechanical strength. Due to such properties of graphene, graphene has been widely used in synthesizing nanometer composite material, manufacturing electronic components, and other chemical and biological transducers. Although graphene has extraordinary properties and an attractive future of application, there are a variety of factors that limit the development of graphene. For example it is difficult to manufacture, in a large scale, high-purity single-layer graphene. Also, other factors may damage the superior property of graphene. For example, for graphene oxide that obtained from a chemical oxidation process, when subjected to a reduction process to produce reduced graphene oxide, it is hard to control the extent of reduction and is generally impossible to prevent graphene oxide from being re-graphitized. Similarly, graphene obtained through CVD also suffers the problem of graphene being graphitized. Thus, key factors that allows graphene to show the excellent property thereof are how a high specific surface area can be obtained and how to obtain graphene having relatively high degree of reduction. In light of the above problems, the application of graphene as an electrode material in the field of display is susceptible to the superior property of graphene being constrained.

SUMMARY OF THE INVENTION

An object of the present invention is to provide a method for manufacturing graphene composite electrode material, which has a simple process and provides extended service life of the composite electrode material so manufactured.

To achieve the above object, the present invention provides a method for manufacturing a graphene composite electrode material, which comprises the following steps:

(1) providing a glass substrate, the glass substrate having a melting point greater than 1100° C.;

(2) washing the glass substrate and then forming a metal film on the glass substrate;

(3) patterning the metal film to form a circuit pattern; and (4) forming a graphene film on the circuit pattern so as to form a graphene composite electrode material.

The glass substrate is a yttrium oxide based glass substrate, an aluminum oxide based glass substrate, or a silicon dioxide based glass substrate.

In the glass substrate, a total amount of content of alkali metals is less than 0.3 ppm; zirconium content is less than or equal to 0.3 ppm; titanium content is less than or equal to 1.4 ppm; calcium content is less than or equal to 0.6 ppm; magnesium content is less than 0.1 ppm; boron content is less than 0.1 ppm; copper content is less than 0.01 ppm; and phosphorus content is less than 0.2 ppm.

In the glass substrate, lithium content is less than or equal to 0.001 ppm; potassium content is less than 0.2 ppm; and sodium content is less than or equal to 0.1 ppm.

The metal film is formed on the glass substrate by means of sputtering through physical vapor deposition with metal nickel, copper or ruthenium as a target material.

The target material has purity greater than 99.9%.

The metal film has a thickness of 10 nm-500 nm.

Step (3) comprises: coating positive photoresist on the metal film and after exposure and development, applying copper acid etching to form a predetermined pattern, thereby forming the circuit pattern.

Step (4) comprises: providing a mask, attaching the mask to a surface of the glass substrate on which the circuit pattern is formed in such a way as to expose the circuit pattern, and then forming the graphene film on the circuit pattern.

The mask is made of silicon dioxide and the graphene film is formed on the circuit pattern through chemical vapor deposition.

The present invention also provides a method for manufacturing a graphene composite electrode material, which comprises the following steps:

(1) providing a glass substrate, the glass substrate having a melting point greater than 1100° C.;

(2) washing the glass substrate and then forming a metal film on the glass substrate;

(3) patterning the metal film to form a circuit pattern; and (4) forming a graphene film on the circuit pattern so as to form a graphene composite electrode material;

wherein the glass substrate is a yttrium oxide based glass substrate, an aluminum oxide based glass substrate, or a silicon dioxide based glass substrate;

wherein in the glass substrate, a total amount of content of alkali metals is less than 0.3 ppm, zirconium content being less than or equal to 0.3 ppm, titanium content being less than or equal to 1.4 ppm, calcium content being less than or equal to 0.6 ppm, magnesium content being less than 0.1 ppm, boron content being less than 0.1 ppm, copper content being less than 0.01 ppm, and phosphorus content being less than 0.2 ppm;

wherein in the glass substrate, lithium content is less than or equal to 0.001 ppm, potassium content being less than 0.2 ppm, and sodium content being less than or equal to 0.1 ppm;

wherein the metal film is formed on the glass substrate by means of sputtering through physical vapor deposition with metal nickel, copper or ruthenium as a target material; and wherein the target material has purity greater than 99.9%.

The metal film has a thickness of 10 nm-500 nm.

Step (3) comprises: coating positive photoresist on the metal film and after exposure and development, applying copper acid etching to form a predetermined pattern, thereby forming the circuit pattern.

Step (4) comprises: providing a mask, attaching the mask to a surface of the glass substrate on which the circuit pattern is formed in such a way as to expose the circuit pattern, and then forming the graphene film on the circuit pattern.

The mask is made of silicon dioxide and the graphene film is formed on the circuit pattern through chemical vapor deposition.

The efficacy of the present invention is that the present invention provides a method for manufacturing a graphene composite electrode material, which uses a temperature resistant glass substrate and a metal catalyst to directly grow a graphene film on a circuit pattern thereby requiring no transfer, not affected by solvent applied in transfer, having relatively high quality of film formation, requiring no etching, allowing for direct formation of a graphene composite electrode material, having a simple process, providing an effect of protection of the metal circuit pattern due to stable chemical property of graphene, and thus effectively extending the service life of the graphene composite electrode material.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached sole drawings. In the drawings:

FIG. 1 is a flow chart illustrating a method for manufacturing a graphene composite electrode material according to the present invention.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIG. 1, the present invention provides a method for manufacturing a graphene composite electrode material, which comprises the following steps:

Step 1: providing a glass substrate, the glass substrate having a melting point greater than 1100° C.

The glass substrate is selected from glass substrates that are resistant to high temperatures, preferably glass substrates having a melting point greater than 1100° C. Further, in the glass substrate, the total amount of content of alkali metals (lithium, potassium, and sodium) is less than 0.3 ppm; zirconium content is less than or equal to 0.3 ppm; titanium content is less than or equal to 1.4 ppm; calcium content is less than or equal to 0.6 ppm; magnesium content is less than 0.1 ppm; boron content is less than 0.1 ppm; copper content is less than 0.01 ppm; and phosphorus content is less than 0.2 ppm. Preferably, in the glass substrate, lithium content is less than or equal to 0.001 ppm; potassium content is less than 0.2 ppm; and sodium content is less than or equal to 0.1 ppm.

In the instant embodiment, the glass substrate is a yttrium oxide based glass substrate, an aluminum oxide based glass substrate, or a silicon dioxide based glass substrate.

Step 2: washing the glass substrate and then forming a metal film on the glass substrate.

The metal film is formed on the glass substrate by means of sputtering through physical vapor deposition (PVD) with metal nickel (Ni), copper (Cu), or ruthenium (Ru) as a target material. The target material has purity greater than 99.9%. The metal film has a thickness of 10 nm-500 nm.

Step 3: patterning the metal film to form a circuit pattern.

Specifically, positive photoresist is coated on the metal film. After exposure and development, copper acid etching is applied to form a predetermined pattern so as to form the circuit pattern.

Step 4: forming a graphene film on the circuit pattern to form a graphene composite electrode material.

Specifically, a mask is provided. The mask is attached to a surface of the glass substrate on which the circuit pattern is formed in such a way that the circuit pattern is exposed. Then, the graphene film is formed on the circuit pattern.

In the instant embodiment, the mask is made of silicon dioxide, which has a deformation point of 1075° C., an annealing point of 1180° C., a hardening point of 1730° C., a highest temperature for continuous use of 1100° C., and can be used at 1450° C. for a short period of time. Since the mask is resistant to high temperature, has a small thermal expansion coefficient, and has a small amount of deformation at 1000° C., the precision of formation of the graphene film can be secured.

The graphene film is formed through chemical vapor deposition (CVD) on the circuit pattern. Specifically, in the CVD operation, a mixed gas of $CH_4$ and $H_2$/Ar or a mixed gas of $CH_4$ and $H_2$ is used, in an environment of 600-1050° C. and 40 Pa-5 kPa, to obtain graphene films having thickness of 0.35 nm-50 nm and surface resistance of 0.1-500Ω/□ according to the time interval of deposition.

In summary, the present invention provides a method for manufacturing a graphene composite electrode material, which uses a temperature resistant glass substrate and a metal catalyst to directly grow a graphene film on a circuit pattern thereby requiring no transfer, not affected by solvent applied in transfer, having relatively high quality of film formation, requiring no etching, allowing for direct formation of a graphene composite electrode material, having a simple process, providing an effect of protection of the metal circuit pattern due to stable chemical property of graphene, and thus effectively extending the service life of the graphene composite electrode material.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a graphene composite electrode material, comprising the following steps:
   (1) providing a glass substrate, the glass substrate having a melting point greater than 1100° C.;
   (2) washing the glass substrate and then forming a metal film on the glass substrate;
   (3) patterning the metal film to form a circuit pattern; and
   (4) forming a graphene film on the circuit pattern so as to form a graphene composite electrode material;
   wherein the metal film is formed on the glass substrate by means of sputtering through physical vapor deposition with metal ruthenium as a target material.

2. The method for manufacturing the graphene composite electrode material as claimed in claim 1, wherein the glass substrate is a yttrium oxide based glass substrate, an aluminum oxide based glass substrate, or a silicon dioxide based glass substrate.

3. The method for manufacturing the graphene composite electrode material as claimed in claim 2, wherein in the glass substrate, a total amount of content of alkali metals is less than 0.3 ppm, zirconium content being less than or equal to 0.3 ppm, titanium content being less than or equal to 1.4 ppm, calcium content being less than or equal to 0.6 ppm, magnesium content being less than 0.1 ppm, boron content being less than 0.1 ppm, copper content being less than 0.01 ppm, and phosphorus content being less than 0.2 ppm.

4. The method for manufacturing the graphene composite electrode material as claimed in claim 3, wherein in the glass substrate, lithium content is less than or equal to 0.001 ppm, potassium content being less than 0.2 ppm, and sodium content being less than or equal to 0.1 ppm.

5. The method for manufacturing the graphene composite electrode material as claimed in claim 1, wherein the target material has purity greater than 99.9%.

6. The method for manufacturing the graphene composite electrode material as claimed in claim 1, wherein the metal film has a thickness of 10 nm-500 nm.

7. The method for manufacturing the graphene composite electrode material as claimed in claim 1, wherein step (3) comprises: coating positive photoresist on the metal film and after exposure and development, applying etching to the metal film to form a predetermined pattern, thereby forming the circuit pattern.

8. The method for manufacturing the graphene composite electrode material as claimed in claim 1, wherein step (4) comprises: providing a mask, attaching the mask to a surface of the glass substrate on which the circuit pattern is formed in such a way as to expose the circuit pattern, and then forming the graphene film on the circuit pattern.

9. The method for manufacturing the graphene composite electrode material as claimed in claim 8, wherein the mask is made of silicon dioxide and the graphene film is formed on the circuit pattern through chemical vapor deposition.

10. A method for manufacturing a graphene composite electrode material, comprising the following steps:
   (1) providing a glass substrate, the glass substrate having a melting point greater than 1100° C.;
   (2) washing the glass substrate and then forming a metal film on the glass substrate;
   (3) patterning the metal film to form a circuit pattern; and
   (4) forming a graphene film on the circuit pattern so as to form a graphene composite electrode material;
   wherein the glass substrate is a yttrium oxide based glass substrate, an aluminum oxide based glass substrate, or a silicon dioxide based glass substrate;
   wherein in the glass substrate, a total amount of content of alkali metals is less than 0.3 ppm, zirconium content being less than or equal to 0.3 ppm, titanium content being less than or equal to 1.4 ppm, calcium content being less than or equal to 0.6 ppm, magnesium content being less than 0.1 ppm, boron content being less than 0.1 ppm, copper content being less than 0.01 ppm, and phosphorus content being less than 0.2 ppm;
   wherein in the glass substrate, lithium content is less than or equal to 0.001 ppm, potassium content being less than 0.2 ppm, and sodium content being less than or equal to 0.1 ppm;
   wherein the metal film is formed on the glass substrate by means of sputtering through physical vapor deposition with metal ruthenium as a target material; and
   wherein the target material has purity greater than 99.9%.

11. The method for manufacturing the graphene composite electrode material as claimed in claim 10, wherein the metal film has a thickness of 10 nm-500 nm.

12. The method for manufacturing the graphene composite electrode material as claimed in claim 10, wherein step (3) comprises: coating positive photoresist on the metal film and after exposure and development, applying etching to the metal film to form a predetermined pattern, thereby forming the circuit pattern.

13. The method for manufacturing the graphene composite electrode material as claimed in claim 10, wherein step (4) comprises: providing a mask, attaching the mask to a surface of the glass substrate on which the circuit pattern is formed in such a way as to expose the circuit pattern, and then forming the graphene film on the circuit pattern.

14. The method for manufacturing the graphene composite electrode material as claimed in claim 13, wherein the mask is made of silicon dioxide and the graphene film is formed on the circuit pattern through chemical vapor deposition.

* * * * *